United States Patent [19]
Conlon et al.

[11] Patent Number: 5,035,939
[45] Date of Patent: Jul. 30, 1991

[54] MANUFACTURE OF PRINTED CIRCUIT BOARDS

[75] Inventors: Edward J. Conlon, Princeton; Ashok N. Prabhu, East Windsor, both of N.J.; Simon M. Boardman, Holland, Pa.; Valerie A. Pendrick, Lambertville, N.J.

[73] Assignee: David Sarnoff Research Center, Inc., Princeton, N.J.

[21] Appl. No.: 477,393

[22] Filed: Feb. 9, 1990

[30] Foreign Application Priority Data

Aug. 31, 1989 [GB] United Kingdom ............... 8919710
Aug. 31, 1989 [GB] United Kingdom ............... 8919711
Sep. 21, 1989 [GB] United Kingdom ............... 8921385

[51] Int. Cl.5 ............................................. B32B 3/00
[52] U.S. Cl. ................................... 428/137; 428/209; 428/210; 428/426; 428/457; 428/901; 430/311; 430/312; 361/397
[58] Field of Search ............... 430/311, 312; 428/209, 428/210, 426, 457, 901; 361/397

[56] References Cited

U.S. PATENT DOCUMENTS 4,897,338 1/1990 Spicciati et al. ................... 430/317
4,902,610 2/1990 Shipley ............................. 430/312

OTHER PUBLICATIONS

Article of J. R. Jordan, "Protopatterned Thick Film Dielectric Production Process, Part I", Inside ISHM, Mar.-Apr. 1987, pp. 14-15.
Article of J. R. Jordan, "Photopatterned Thick Film Dielectric Production Process, Part 2", Inside ISHM, May-Jun. 1987, pp. 14-15.

Primary Examiner—Patrick J. Ryan
Attorney, Agent, or Firm—W. J. Burke

[57] ABSTRACT

In the manufacture of printed circuit boards, a first photoresist post is patterned on the substrate where via holes are to be made. A dielectric layer is put down, a second photoresist layer patterned so as to have openings over and in alignment with the photoresist posts, and the dielectric removed from the via holes. Barrier layers to reduce interaction between layers of copper, dielectric and photoresist during filling of the via holes with a conductor via fill ink are also described.

17 Claims, 2 Drawing Sheets

MANUFACTURE OF PRINTED CIRCUIT BOARDS

This invention relates to the manufacture of printed circuit boards. More particularly, this invention relates to printed circuit boards having small via holes of high aspect ratio.

BACKGROUND OF THE INVENTION

Screen printing techniques have long been used to fabricate printed circuit boards and other substrates for the electronics industry, wherein conductive inks are applied to the substrate through a patterned screen and fired to remove the organics, leaving a patterned layer of the conductor, e.g. copper, on the substrate.

As the patterns became smaller and more intricate, screen printing was supplemented by photoresist technology. The conductive material was put down as a thin layer, a photoresist layer applied thereover, and then exposed and developed to form a patterned layer. The uncoated conductive layer was etched away, and the remaining photoresist dissolved away or fired, leaving a patterned conductive layer on the substrate.

This basic technique has also been applied to other layers, such as dielectric layers made from devitrifying glasses which are mixed with an organic vehicle to form a paste. The paste is applied to the entire substrate, which substrate can be covered by a patterned conductive layer, and dried. In order to gain access to the underlying conductor pattern, via holes are formed in the dielectric layer which is to be filled with a conductor such as copper. A photoresist layer is applied over the dried dielectric layer, the resist is exposed using a photo tool to define the via holes, the resist developed to remove unexposed photoresist, and the dielectric washed away to form via apertures. The substrate is then fired in an appropriate atmosphere, e.g. nitrogen for copper, air for inert conductors such as silver and gold, whereupon the organic materials, the paste organic vehicle and remaining photoresist, burn away, and the glass dielectric sinters onto the substrate. The via holes are then filled with copper using screen printing techniques.

The above technique is eminently suitable to form via holes between about 100 and 250 micrometers in diameter. However, with the increased miniaturization required for the electronics and computer industries, it is desired to make smaller via holes between about 25 and 125 micrometers in diameter.

Conventional screen printing or photoresist techniques have grave problems when very small via holes through comparatively thick layers of, inter alia, dielectric, are to be made.

The dielectric paste in the small vias is very difficult to remove, especially when the dielectric layer is quite thick. The dielectric cannot be completely removed from the side walls, and in some cases cannot be removed down to the bottom of the via hole. In addition, it is difficult to fill small holes with copper paste using screen printing techniques.

Further, the photoresist is absorbed by the dielectric ink to some extent during the drying step. Thus when the photoresist is subsequently exposed to ultraviolet light, the dielectric is rendered gummy which further interferes with removal of the dielectric layer. This exacerbates the difficulty of removal of portions of the dielectric paste.

Another problem encountered when making very small patterns and via connections is that all of the various unfired or fired layers of conductor and dielectric inks, as well as specialty inks such as dielectric overglaze inks and the like, undergo some absorption of the conductive copper into underlying and overlying dielectric layers, and some absorption of photoresist into both the copper layers and the dielectric layers. While these problems are present to some extent in the manufacture of all printed circuit boards, they are more troublesome when very small patterns and via holes are to be made.

SUMMARY OF THE INVENTION

We have found that by reducing the amount of dielectric paste to be removed in a via hole, small diameter vias and other patterns of high aspect ratio can be formed readily, producing substrates and printed circuit boards that are an advance over the art. Also we have found that a polymeric barrier layer can be deposited between all the various layers, including photoresist, conductor layers and dielectric layers, as well as various known intermediate layers, to reduce or eliminate the absorption and interaction of one layer by another.

DETAILED DESCRIPTION OF THE INVENTION

In the process of the present invention very small via holes having high aspect ratios can be made, e.g., via holes between about 50 and 125 micrometers in diameter, using photoresist printing techniques, as contrasted with the state of the art manufacture of via holes of 100-250 micrometers in diameter.

Figure 1:
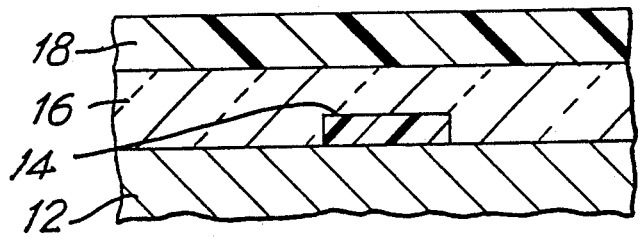
FIGS. 1-2 illustrate the steps of preparation of via holes in dielectric layers in accordance with the method of the invention.

According to the present process, and as shown in FIG. 1, a first layer of photoresist 14 is deposited on the substrate 12 and patterned in conventional manner so that photoresist "posts" remain where the via holes are to be made.

The substrate 12 can be any conventional printed circuit board material such as metal or ceramic, which can withstand firing temperatures of about 600° C. to 1000° C. For example, steel, alumina and glass coated (glazed) alumina can be employed as the substrate.

A first copper pattern (not shown) can be applied to the substrate using screen printing techniques, and the copper paste dried and fired in nitrogen at 900° C. prior to forming the photoresist "posts".

A suitable devitrifying glass dielectric ink layer 16 is deposited over the patterned photoresist layer 14 using conventional screen printing or spinning techniques. The dielectric glass layer 16 is dried at a temperature between about 110° C. and 125° C. for about 15 minutes, but not fired. It will be apparent that the glass dielectric layer 16 is thinnest where the via holes are to be made. The organics in the dielectric paste can be partially or completely removed by subjecting the dielectric paste layer to an oxygen plasma treatment for from about 10 to 60 minutes.

A second photoresist layer 18 is now applied over the dielectric layer 16. An opening 20 is formed where the via holes are desired and over the "posts", by exposing and developing the second photoresist layer 18 using conventional techniques. The pattern in the second photoresist layer 18 thus is complementary to the first photoresist layer 14.

Figure 2:
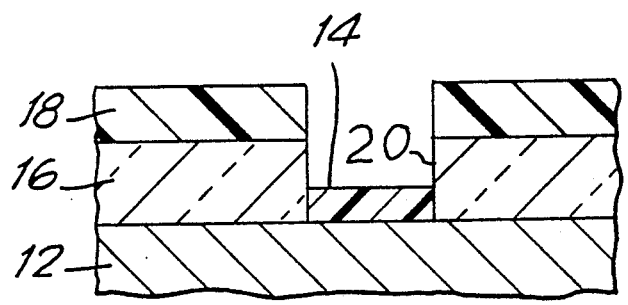

The dielectric layer 16 is removed from the opening 20 during development of the second photoresist layer 18, as shown in FIG. 2. Due to the presence of the photoresist "posts" 14, the layer of dielectric 16 to be removed from the opening 20 is comparatively shallow and thus the dielectric 16 can be removed completely and cleanly, even from narrow holes between about 50 and 125 micrometers in diameter. FIG. 2 illustrates the patterned substrate just before firing or subsequent patterning takes place.

When the substrate is fired, as in nitrogen at a temperature between about 800° C. and 900° C., the remaining photoresist 14 in the via holes is completely burned away and the dielectric layer 16 is sintered. Thus the resulting via hole can have a high aspect ratio (height:diameter) of up to 0.5 for 50 micrometer diameter via holes.

The via holes now must be filled with a conductive material such as copper, using a conventional via fill paste or ink of copper powder in an organic vehicle.

In order to impart a smooth surface to the substrate, and to eliminate or reduce migrations from one layer to another, optionally a suitable resin barrier layer is applied between the layers on the substrate.

The barrier layer must be a material that is impermeable to photoresist migration into a conductive or dielectric layer; must be compatible with both a copper or dielectric layer and photoresist to avoid blistering during firing; it should be easy to remove as by washing during development of the photoresist; and it must be completely removed upon heating to the firing temperature of the printing circuit boards, either in air or in an inert atmosphere.

A polymer available as QPAC, a trademark of Air Products and Chemical Co., has been found to be a suitable barrier layer. This polymer is a poly(alkylene carbonate) which is soluble in 2-ethoxy ethyl acetate and compatible with Waycoat SC 450 photoresist, available from Hunt Chemical Co. It can be rinsed away from exposed areas with acetone. It burns cleanly in nitrogen or an oxygen-containing gas such as air.

Figure 3:
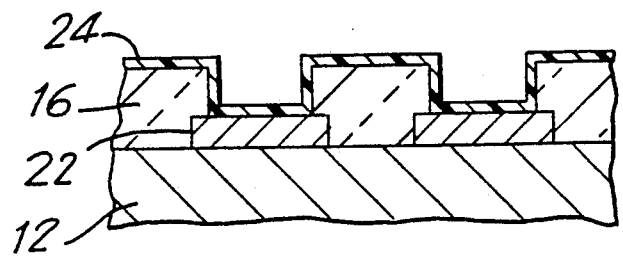
FIGS. 3-6 illustrate the steps of preparation of filled via holes in dielectric layers over a patterned copper layer using a barrier layer over said dielectric layer in accordance with another embodiment of the invention.

Referring now to FIG. 3, one or more layers of a barrier resin 24 is spin coated over the patterned dielectric layer 16 and a copper layer 22, drying at about 120° C. for about 20 minutes between each application. This coating forms a barrier between the dielectric layer 16 and a subsequently applied conductor layer.

Figure 4:
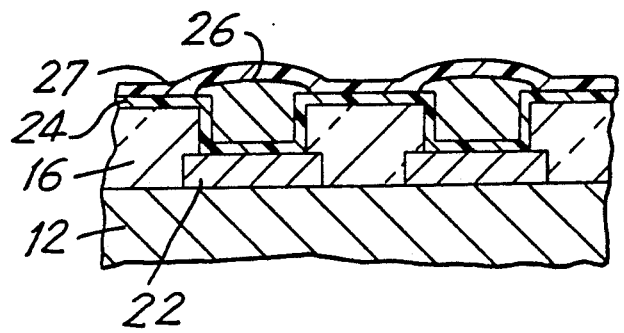

A conventional thick copper via fill paste or ink 26 is next screen printed onto the substrate so that the print is somewhat larger than the final feature size, as shown in FIG. 4. The via fill ink 26 is then dried at about 110° C. for about 20 minutes.

One or more layers of a barrier resin 27 is spin coated over the entire substrate, drying at about 120° C. for about 20 minutes between each application. This coating forms a barrier between the copper layer 26 and a subsequently applied photoresist layer.

Figure 5:
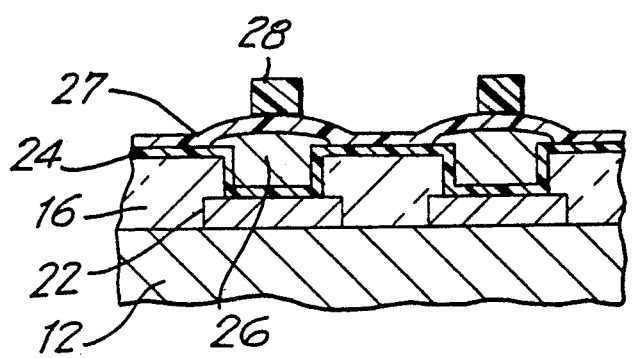

A photoresist layer 28 is applied, exposed to pattern the desired via features and conductor lines, if desired, and developed so that the desired copper is protected under the exposed area of the photoresist, as shown in FIG. 5.

Figure 6:
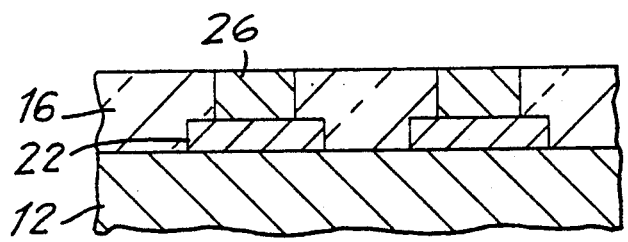

The excess portion of the via fill ink layer 26 is removed along with the excess portions of the barrier layers 24 and 27 in those areas not covered with the photoresist layer 28, by spraying with acetone. The substrate 12 is fired in nitrogen at temperatures between about 600° C. and 1000° C. to remove the remaining photoresist and organics, while the copper pattern is sintered. The resultant substrate is shown in FIG. 6.

The barrier layers can also be applied during other steps of the process. For example, when the dielectric layer has been oxygen plasma treated to remove organics, as detailed above, a barrier layer can be applied over the dielectric layer 16 prior to applying the photoresist layer 18 thereover. The barrier layer can be removed by washing with acetone after the development of the photoresist 18. A barrier layer is also suitably applied to the substrate prior to application of the first photoresist layer 14.

Although the present invention has been described using a particular sequence of steps, and using particular materials, other materials and steps can be utilized as will be known to one skilled in the art, and the invention is not meant to be limited to the details described hereinabove. The invention is only to be limited by the following claims.

We claim:

1. A substrate having a first patterned photoresist layer thereon, a dielectric layer thereof, and a patterned photoresist layer having openings over and aligned with said first patterned photoresist layer.

2. A substrate having a patterned copper layer thereon, a dielectric layer thereover and a barrier layer contacting said dielectric layer.

3. A substrate according to claim 2 wherein said dielectric layer is patterned to have via holes therein.

4. A substrate according to claim 2 wherein a photoresist layer is deposited over said barrier layer.

5. An unfired printed circuit board having a patterned copper circuit thereon, a dielectric layer thereover having via holes therein of between about 50 and 125 micrometers in diameter, and a photoresist post at the bottom of one or more said via holes.

6. A printed circuit board according to claim 5 wherein a barrier layer is deposited over said dielectric layer.

7. An unfired printed circuit board having a patterned copper circuit thereon, a dielectric layer thereover having via holes therein between about 50 and 125 micrometers in diameter, a first barrier layer over said dielectric layer, a conductor via fill ink filling said via holes, and a second barrier layer over said conductor via fill ink.

8. A printed circuit board according to claim 7 having a photoresist layer over said second barrier layer.

9. A printed circuit board according to claim 7 wherein said conductor is copper.

10. A method of making small via holes of high aspect ratio on a substrate which comprises
   1) applying a first patterned photoresist layer on said substrate such that the photoresist is situated where the via hole is to be made,
   2) depositing a dielectric ink layer thereover,
   3) subjecting the dielectric layer to an oxygen plasma treatment,
   4) applying a second photoresist layer over said dielectric layer, 5) patterning said second photoresist layer so that it has an opening over and aligned with said first photoresist layer, and 6) removing said dielectric in said opening.

11. A method according to claim 10 wherein a barrier layer is deposited prior to the first photoresist layer.

12. A method according to claim 10 wherein a barrier layer is deposited over the dielectric layer.

13. A method according to claim 10 wherein a barrier layer is deposited over the second photoresist layer.

14. A method according to claim 10 wherein a conductor via fill ink is deposited in said opening.

15. A method according to claim 14 wherein a barrier layer is deposited over said via fill ink layer.

16. A method according to claim 10 wherein a barrier layer is deposited over a pattern copper layer on said substrate.

17. A method according to claim 14 wherein said conductor is copper.

* * * * *